United States Patent
Chen et al.

(10) Patent No.: US 10,014,830 B2
(45) Date of Patent: Jul. 3, 2018

(54) DC BIAS CIRCUIT AND THE RADIO FREQUENCY RECEIVER CIRCUIT USING THE SAME

(71) Applicant: Intel Corporation, Santa Clara, CA (US)

(72) Inventors: Hsien-Ku Chen, New Taipei (TW); Pei-Wei Chen, New Taipei (TW)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 14/849,677

(22) Filed: Sep. 10, 2015

(65) Prior Publication Data
US 2016/0380599 A1  Dec. 29, 2016

(30) Foreign Application Priority Data

Jun. 29, 2015  (CN) .......................... 2015 1 0369651

(51) Int. Cl.
*H03F 3/04*    (2006.01)
*H03F 1/30*    (2006.01)
*H03F 3/193*   (2006.01)
*H03F 3/45*    (2006.01)

(52) U.S. Cl.
CPC ............. *H03F 1/301* (2013.01); *H03F 3/193* (2013.01); *H03F 3/45183* (2013.01); *H03F 3/45659* (2013.01); *H03F 2200/294* (2013.01); *H03F 2200/451* (2013.01)

(58) Field of Classification Search
CPC ..................................................... H03F 1/0225
USPC .................................. 330/296, 126, 285, 297
See application file for complete search history.

(56) References Cited

U.S. PATENT DOCUMENTS

| 8,106,712 B2* | 1/2012 | Lee ........................ H03F 1/0261 330/285 |
| 2010/0301935 A1* | 12/2010 | Tanaka ...................... H03F 1/30 330/133 |

FOREIGN PATENT DOCUMENTS

| CN | 1397106 A | 2/2003 |
| CN | 1515069 A | 7/2004 |
| CN | 1741369 A | 3/2006 |
| CN | 1953339 A | 4/2007 |

(Continued)

OTHER PUBLICATIONS

Office Action dated Jan. 4, 2017 for Chinese Patent Application No. 201510369651.2.

*Primary Examiner* — Khanh V Nguyen
*Assistant Examiner* — Khiem Nguyen
(74) *Attorney, Agent, or Firm* — Schiff Hardin LLP

(57) ABSTRACT

The present invention presents a DC bias circuit including a first biasing circuit and a second biasing circuit. The first biasing circuit includes a first biasing transistor and a first biasing resistor for providing a first bias voltage to an output transistor of the mixer circuit. The first biasing transistor and the output transistor are the same type of transistor and have equal channel lengths. The second biasing circuit includes a second biasing transistor and a second biasing resistor for providing a second bias voltage to an input transistor of the common gate amplifier circuit. The second biasing transistor and the input transistor are the same type of transistor and have equal channel lengths. When the input transistor and the output transistor all operate in a saturation region, alternating current signals output from the mixer circuit is unrelated to a threshold voltage of the output transistor.

5 Claims, 10 Drawing Sheets

(56) References Cited

FOREIGN PATENT DOCUMENTS

| CN | 104426486 A | 3/2015 |
|----|----|----|
| EP | 2045915 A1 | 4/2009 |
| WO | WO-2014139376 A1 | 9/2014 |

\* cited by examiner

DC BIAS CIRCUIT AND THE RADIO FREQUENCY RECEIVER CIRCUIT USING THE SAME

CROSS REFERENCE TO RELATED APPLICATIONS

This Application claims priority of China Patent Application No. 201510369651.2, filed on Jun. 29, 2015, the entirety of which is incorporated by reference herein.

BACKGROUND OF THE INVENTION

Field of the Invention

The technical field relates to a DC (direct current) bias circuit, and more particularly to a DC bias circuit used to stabilize alternating current signals output from a mixer circuit of a radio frequency receiver circuit.

Description of the Related Art

FIG. 1 is a block diagram of a radio frequency receiver circuit 10. The radio frequency receiver circuit 10 comprises a low noise amplifier 101, a mixer circuit 102, and an amplifier circuit 103. The radio frequency receiver circuit 10 receives a plurality of radio frequency signals from an antenna 11 and processes the radio frequency signals, wherein the radio frequency signals are high-frequency electromagnetic signals spread on some specific frequency bands, for example, 5 GHz or 2.4 GHz. The low noise amplifier 101 is used to process the received radio frequency signals. The mixer circuit 102 is also called a downconverter and is used to perform a down-conversion operation on the signals processed by the low noise amplifier 101. Finally, the amplifier circuit 103 receives a plurality of alternating current signals output from the mixer circuit 102 and outputs a plurality of corresponding alternating voltage signals. In FIG. 1, the low noise amplifier 101, the mixer circuit 102, and the amplifier circuit 103 can be implemented by analog circuits. In an analog circuit design, variations in the semiconductor process have always been an important issue. This is because variations in the semiconductor process can affect the accuracy of the design parameters of the analog circuits.

BRIEF SUMMARY OF THE INVENTION

A detailed description is given in the following embodiments with reference to the accompanying drawings.

An embodiment of the present invention provides a DC bias circuit for DC biasing a mixer circuit and a common gate amplifier circuit. The DC bias circuit comprises a first biasing circuit and a second biasing circuit. The first biasing circuit comprises a first biasing transistor and a first biasing resistor, wherein the first biasing transistor and the first biasing resistor provide a first DC bias voltage to an output transistor of the mixer circuit so that the output transistor operates in a saturation region; and wherein the first biasing transistor and the output transistor are the same type of transistor and have equal channel lengths. The second biasing circuit comprises a second biasing transistor and a second biasing resistor, wherein the second biasing transistor and the second biasing resistor provide a second DC bias voltage to an input transistor of the common gate amplifier circuit so that the input transistor operates in the saturation region; wherein the second biasing transistor and the input transistor are the same type of transistor and have equal channel lengths; and wherein when the input transistor and the output transistor all operate in the saturation region, a plurality of alternating current signals output from the mixer circuit is unrelated to a threshold voltage of the output transistor, and the alternating current signals is unrelated to a threshold voltage of the input transistor.

An embodiment of the present invention provides a DC bias circuit for DC biasing a mixer circuit and a common gate amplifier circuit. The DC bias circuit comprises a first biasing circuit and a second biasing circuit. The first biasing circuit provides a first DC bias voltage to a gate of a first transistor of the mixer circuit so that the first transistor operates in a saturation region. The first biasing circuit comprises a third transistor, a first resistor, and a first current source, wherein a gate and a drain of the third transistor are electrically connected to a first node, a source of the third transistor is electrically connected to ground, and the first and third transistor are the same type of transistor. The first resistor is electrically connected between the gate of the first transistor and the first node. The first current source is used to output a first DC current to the third transistor. The second biasing circuit provides a second DC bias voltage to a gate of a second transistor of the common gate amplifier circuit so that the second transistor operates in a saturation region. The second biasing circuit comprises a fourth transistor, a second resistor, and a second current source, wherein a gate and a drain of the fourth transistor are electrically connected to a second node, a source of the fourth transistor is electrically connected to ground, and the second and fourth transistor are the same type of transistor. The second resistor is electrically connected between the gate of the second transistor and the second node. The second current source is used to output a second DC current to the fourth transistor, wherein the mixer circuit receives a high-frequency input signal from a drain of the first transistor and outputs an alternating current signal through a source of the first transistor; wherein the common gate amplifier circuit receives the alternating current signal from a drain of the second transistor and outputs an alternating voltage signal through a source of the second transistor; wherein the source of the first transistor and the source of the second transistor are electrically connected to a third node, and a third current source is electrically connected between the third node and ground; and wherein the first and third transistors have equal channel lengths, and the second and fourth transistors have equal channel lengths so that a plurality of alternating current signals output from the mixer circuit is unrelated to a threshold voltage of the output transistor.

An embodiment of the present invention provides a radio frequency receiver circuit. The radio frequency receiver circuit comprises a mixer circuit, a common gate amplifier circuit, a first biasing circuit and a second biasing circuit. The mixer circuit comprises a first transistor, wherein the mixer circuit receives a plurality of radio frequency signals from a drain of the first transistor and outputs a plurality of alternating current signals from a source of the first transistor. The common gate amplifier circuit comprises a second transistor, wherein the common gate amplifier circuit receives the alternating current signals from a drain of the second transistor and outputs a plurality of alternating voltage signals from a source of the second transistor. The first biasing circuit provides a first DC bias voltage to a gate of the first transistor of the mixer circuit so that the first transistor operates in a saturation region. The first biasing circuit comprises a third transistor, a first resistor, and a first current source, wherein a gate and a drain of the third transistor are electrically connected to a first node, a source of the third transistor is electrically connected to ground, and the first and third transistor are the same type of transistor. The first resistor is electrically connected between the gate of the first transistor and the first node. The first current source is used to output a first DC current to the third transistor. The second biasing circuit provides a second DC bias voltage to a gate of the second transistor of the common gate amplifier circuit so that the second transistor operates in a saturation region. The second biasing circuit comprises a fourth transistor, a second resistor, and a second current source, wherein a gate and a drain of the fourth transistor are electrically connected to a second node, a source of the fourth transistor is electrically connected to ground, and the second and fourth transistor are the same type of transistor. The second resistor is electrically connected between the gate of the second transistor and the second node. The second current source is used to output a second DC current to the fourth transistor, wherein the mixer circuit receives a high-frequency input signal from a drain of the first transistor and outputs an alternating current signal through a source of the first transistor; wherein the common gate amplifier circuit receives the alternating current signal from a drain of the second transistor and outputs an alternating voltage signal through a source of the second transistor; wherein the source of the first transistor and the source of the second transistor are electrically connected to a third node, and a third current source is electrically connected between the third node and ground; and wherein the first and third transistors have equal channel lengths, and the second and fourth transistors have equal channel lengths so that a plurality of alternating current signals output from the mixer circuit is unrelated to a threshold voltage of the output transistor.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

In view of the variations in the semiconductor process, the present invention provides a DC bias circuit to apply into the radio frequency receiver circuit 10.

Figure 1:
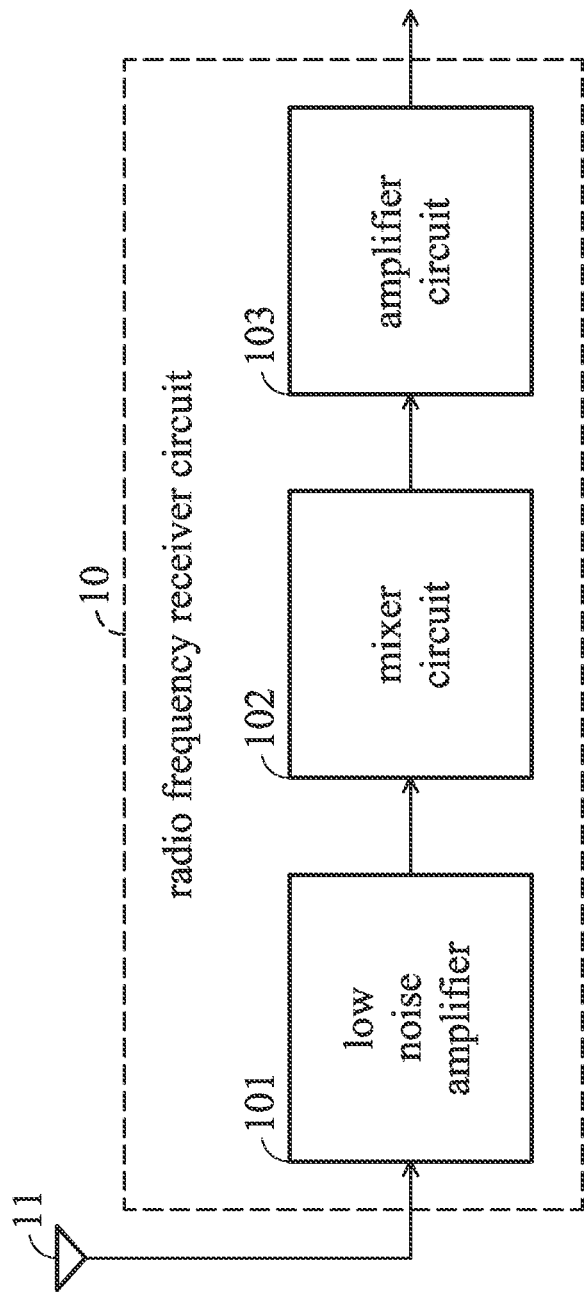
FIG. 1 is a block diagram of a radio frequency receiver circuit 10.
Figure 2A:
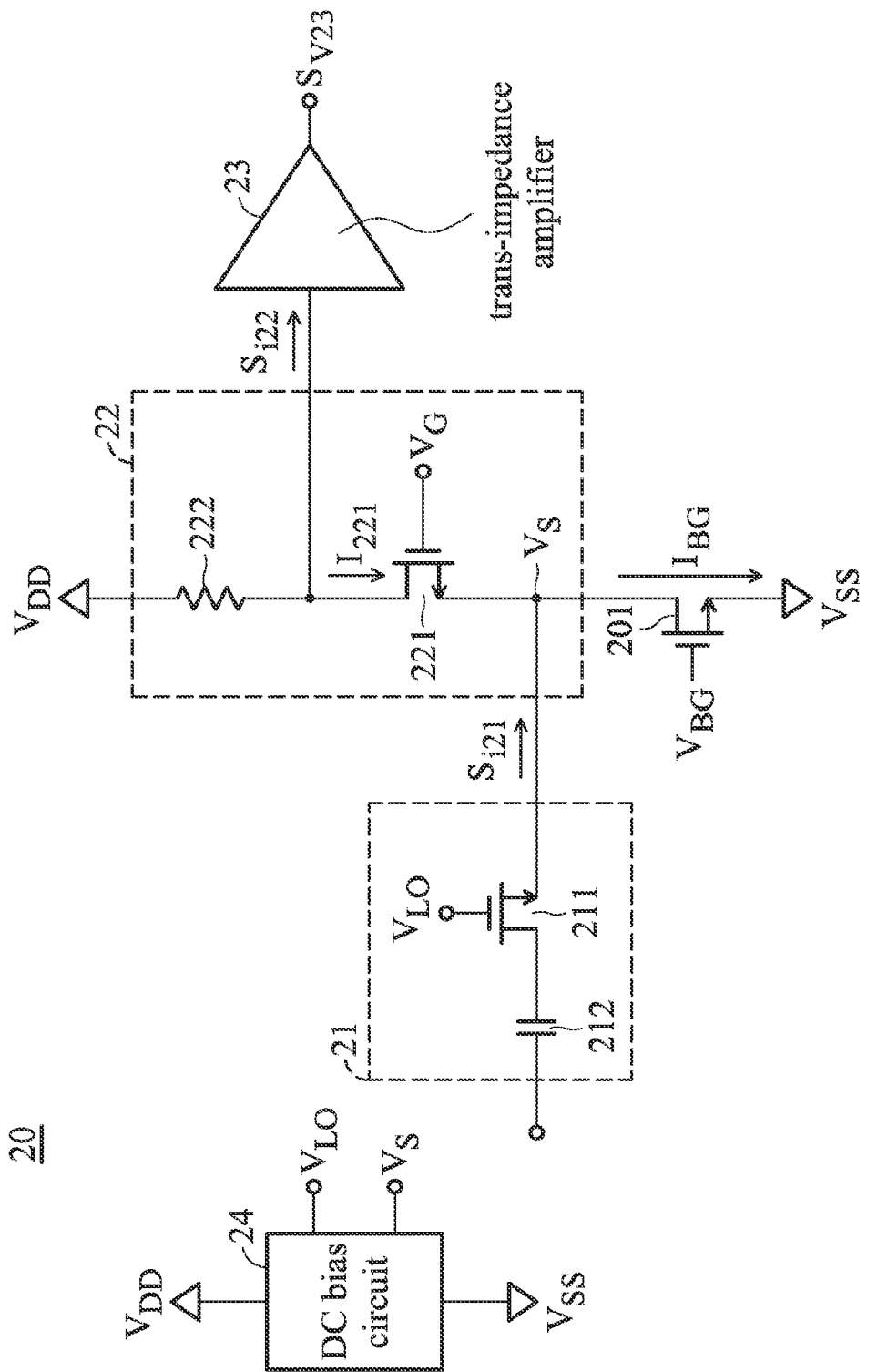
FIG. 2A is a circuit diagram of a radio frequency receiver circuit 20 according to a first embodiment of the present invention.

FIG. 2A is a circuit diagram of a radio frequency receiver circuit 20 according to a first embodiment of the present invention. In the first embodiment, the radio frequency receiver circuit 20 comprises a passive mixer circuit 21, a common gate amplifier 22, a trans-impedance amplifier 23, and a DC bias circuit 24. In the first embodiment, the passive mixer circuit 21 comprises a switch transistor 211 and a capacitor 212. The common gate amplifier 22 comprises a transistor 221, a resistor 222, and a current source transistor 201. In the first embodiment, the DC bias circuit 24 is used to provide a DC bias voltage $V_{BIAS24}$ ($V_{LO}-V_S$) across a gate and a source of the switch transistor 211 of the passive mixer circuit 21.

In the first embodiment, the capacitor 212 of the passive mixer circuit 21 is used for DC block. A drain of the switch transistor 211 of the passive mixer circuit 21 is used to receive the radio frequency signal processed from the low noise amplifier 101. The gate of the switch transistor 211 of the passive mixer circuit 21 is used to induce a periodic signal generated by an oscillator. The source of the switch transistor 211 of the passive mixer circuit 21 is used to output a plurality of alternating current signals $S_{i21}$.

In the first embodiment, a source of the transistor 221 is electrically connected to the source of the switch transistor 211, a gate of the transistor 221 is electrically connected to a DC bias voltage $V_G$, and a drain of the transistor 221 is used to output a plurality of alternating current signals $S_{i22}$ to the trans-impedance amplifier 23. The resistor 222 is used as a bias resistor and is electrically connected between a first voltage source $V_{DD}$ and the drain of the transistor 221. The current source transistor 201 is used as a constant current source which flows through a first constant current $I_{BG}$ and is electrically connected between a second voltage source $V_{SS}$ and a first node $N_1$. In the first embodiment, the second voltage source $V_{SS}$ is electrically connected to ground. The trans-impedance amplifier 23 is used to transform the alternating current signals $S_{i22}$ into a plurality of alternating voltage signals $S_{v23}$.

Figure 2B:
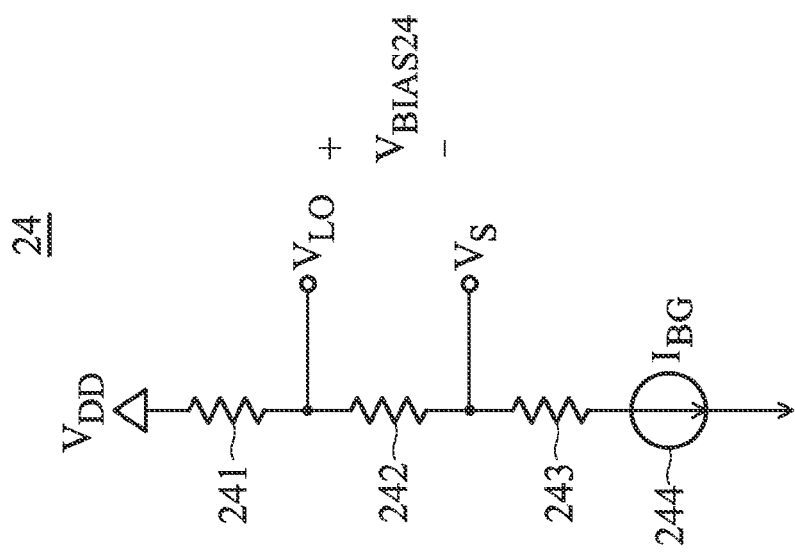
FIG. 2B is a circuit diagram of a DC bias circuit 24 of a passive mixer circuit 21 according to a second embodiment of the present invention.

FIG. 2B is a circuit diagram of a DC bias circuit 24 of a passive mixer circuit 21 according to a second embodiment of the present invention. In the second embodiment, the DC bias circuit 24 comprises a resistor 241, a resistor 242, a resistor 243, and a constant current source 244. The DC bias circuit 24 is used to provide the DC bias voltage $V_{BIAS24}$ ($V_{LO}-V_S$) across the gate and the source of the switch transistor 211 of the passive mixer circuit 21. In the second embodiment, the resistor 241 is electrically connected between the first voltage source $V_{DD}$ and the gate of the switch transistor 211. The resistor 242 is electrically connected between the gate and the source of the switch transistor 211. The resistor 243 is electrically connected between the source of the switch transistor 211 and the constant current source 244. The constant current source 244 is used to provide the first constant current $I_{BG}$ flowing through the resistor 241, the resistor 242, and the resistor 243.

In the second embodiment, the resistor 242 of the DC bias circuit 24 provides the DC bias voltage $V_{BIAS24}$ ($V_{LO}$-$V_S$) across the gate and the source of the switch transistor 211 of the passive mixer circuit 21 so that the switch transistor 211 operates in a saturation region. When the switch transistor 211 operates in the saturation region, a overdrive voltage $V_{OV211}$ of the switch transistor 211 may be represented as follows:

$$V_{OV211} = V_{GS211} - V_{t211} = V_{BIAS24} - V_{t211} \quad (1)$$
$$= I_{BG} * R_{242} - V_{t211},$$

wherein $V_{GS211}$ is a voltage across the gate and the source of the switch transistor 211, $V_{t211}$ is a threshold voltage of the switch transistor 211, $R_{242}$ is a resistance of the resistor 242.

From the above equation (1), the overdrive voltage $V_{OV211}$ of the switch transistor 211 is related to the threshold voltage $V_{t211}$ of the switch transistor 211. Because the threshold voltage $V_{t211}$ is related to the degree of variations in the semiconductor process being about 25% variation, the overdrive voltage $V_{OV211}$ of the switch transistor 211 would be affected thereby. When the switch transistor 211 operates in the saturation region, the alternating current signals $S_{i21}$ output from the switch transistor 211 of the passive mixer circuit 21 would be affected with a different threshold voltage $V_{t211}$. It affects the accuracy of the alternating current signals $S_{i21}$ output from the output terminal of the passive mixer circuit 21.

Returning to the circuit diagram of FIG. 2A: In the second embodiment, the current source transistor 201 is a constant current source and DC current does not flow through the switch transistor 211 of the passive mixer circuit 21. Therefore a DC current flowing through the transistor 221 is equal to the first constant current $I_{BG}$ flowing through the current source transistor 201.

When the transistor 221 operates in the saturation region and the threshold voltage $V_{t211}$ decreases due to a degree of variation of the semiconductor process, the DC voltage of the source of the transistor 221 of the common gate amplifier 22 (i.e. a DC voltage of the first node $N_1$) changes to maintain the first constant current $I_{BG}$ flowing through the current source transistor 201. At this moment, the change of the DC voltage of the first node $N_1$ directly affects the voltage between the gate and the source of the switch transistor 211 of the passive mixer circuit 21, and thereby it affects the alternating current signals $S_{i21}$ output from the switch transistor 211 of the passive mixer circuit 21.

Accordingly, the variation of a threshold voltage $V_{t221}$ of the switch transistor 221 of the common gate amplifier 22 also affects the alternating current signals $S_{i21}$ output from the switch transistor 211 of the passive mixer circuit 21. However, the DC bias circuit 24 shown in FIG. 2B cannot solve the above issue.

Figure 2C:
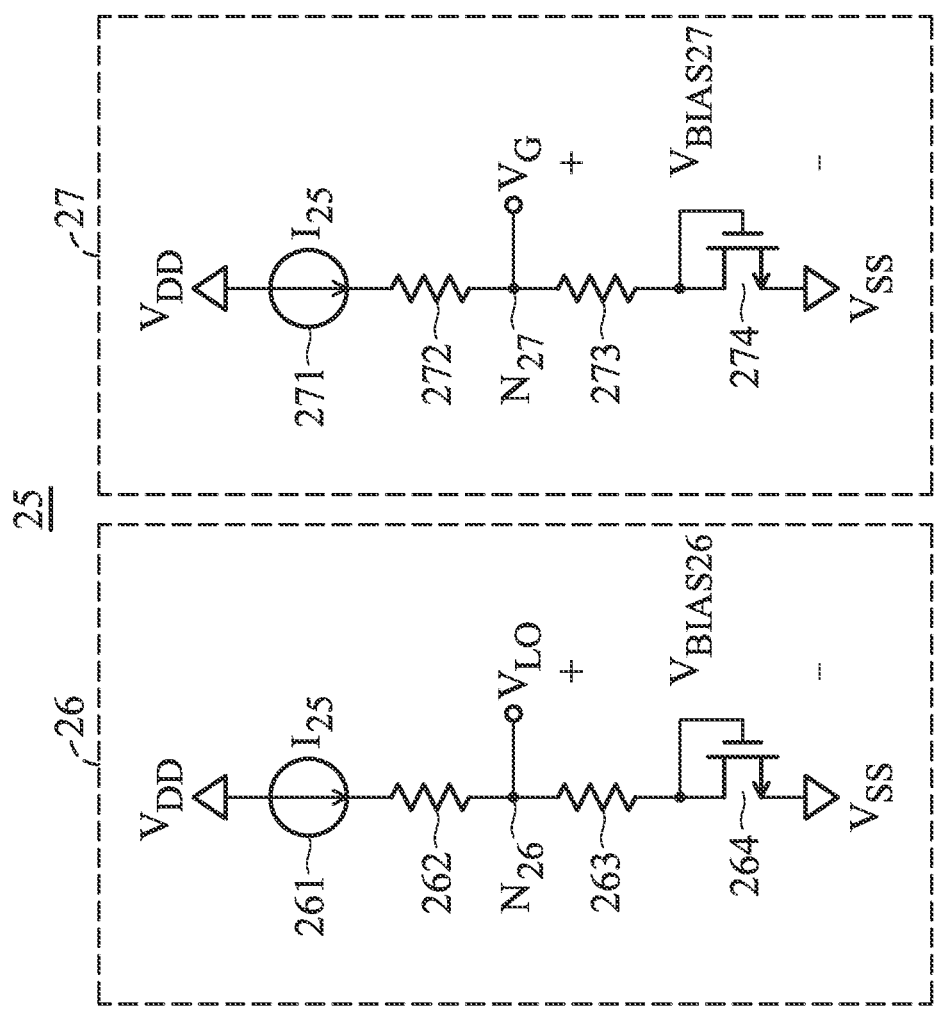
FIG. 2C is a circuit diagram of a DC bias circuit 25 of the passive mixer circuit 21 and a common gate amplifier 22 according to a third embodiment of the present invention.

FIG. 2C is a circuit diagram of a DC bias circuit 25 of the passive mixer circuit 21 and a common gate amplifier 22 according to a third embodiment of the present invention. In the third embodiment, the DC bias circuit 24 shown in the FIG. 2B is replaced by the DC bias circuit 25. In the third embodiment, the DC bias circuit 25 provides a DC bias voltage $V_{BIAS26}$ and a DC bias voltage $V_{BIAS27}$. The DC bias circuit 25 comprises a first DC bias circuit 26 and a second DC bias circuit 27. The first DC bias circuit 26 is used to provide the DC bias voltage $V_{BIAS26}$ to the gate of the switch transistor 211 of the passive mixer circuit 21, and the second DC bias circuit 27 is used to provide the DC bias voltage $V_{BIAS27}$ to the gate of the transistor 221 of the common gate amplifier 22.

In the third embodiment, the first DC bias circuit 26 comprises a current source 261, a resistor 262, a resistor 263, and a bias transistor 264. The current source 261 is electrically connected between the first voltage source $V_{DD}$ and the resistor 262. The current source 261 provides a constant current $I_{25}$ flowing through the resistor 262, the resistor 263, and the bias transistor 264. The resistor 262 is electrically connected between a terminal of the resistor 263 and the current source 261. The other terminal of the resistor 263 is electrically connected to a gate and a drain of the bias transistor 264, i.e. the gate and the drain of the bias transistor 264 electrically connects to each other. A source of the bias transistor 264 is electrically connected to the second voltage source $V_{SS}$. In the third embodiment, the second voltage source $V_{SS}$ is electrically connected to ground. In the third embodiment, the DC bias voltage $V_{BIAS26}$ is equivalent to a voltage across the resistor 263 plus a voltage across the gate and the drain of the bias transistor 264. The DC bias voltage $V_{BIAS26}$ can be represented as follows:

$$V_{BIAS26} = I_{25} * R_{263} + \sqrt{\frac{I_{BG}}{K_{26}}} + V_{t26}, \quad (2)$$

wherein $K_{26}$ is a conductance parameter ($\mu n*W*2L*COX$) of the bias transistor 264, $V_{t26}$ is a threshold voltage of the bias transistor 264, $R_{263}$ is a resistance of the resistor 263.

In the third embodiment, the second DC bias circuit 27 comprises a current source 271, a resistor 272, a resistor 273, and a bias transistor 274. The current source 271 is electrically connected between the first voltage source $V_{DD}$ and the resistor 272. The current source 271 provides the constant current $I_{25}$ flowing through the resistor 272, the resistor 273, and the bias transistor 274. The resistor 272 is electrically connected between a terminal of the resistor 273 and the current source 271. The other terminal of the resistor 273 is electrically connected to a gate and a drain of the bias transistor 274, i.e. the gate and the drain of the bias transistor 274 electrically connects to each other. A source of the bias transistor 274 is electrically connected to the second voltage source $V_{SS}$. In the third embodiment, the second voltage source $V_{SS}$ is electrically connected to ground. In the third embodiment, the DC bias voltage $V_{BIAS27}$ is equivalent to a voltage across the resistor 273 plus a voltage across the gate and the drain of the bias transistor 264. The DC bias voltage $V_{BIAS26}$ can be represented as follows:

$$V_{BIAS27} = I_{25} * R_{273} + \sqrt{\frac{I_{BG}}{K_{27}}} + V_{t27}, \quad (3)$$

wherein $K_{27}$ is a conductance parameter ($\mu n*W*2L*COX$) of the bias transistor 274, $V_{t27}$ is a threshold voltage of the bias transistor 274, $R_{273}$ is a resistance of the resistor 273.

When the second DC bias circuit 27 provides the DC bias voltage $V_{BIAS27}$ to the gate of the transistor 221 of the common gate amplifier 22, a source voltage $V_{S221}$ of the transistor 221 can be obtained from the above equation (3). The source voltage $V_{S221}$ can be represented as follows:

$$V_{S221} = -\sqrt{\frac{I_{BG}}{K_{221}}} + V_{BIAS27} - V_{t221} \qquad (4)$$

$$= -\sqrt{\frac{I_G}{K_{221}}} + I_{25}*R_{273} + \sqrt{\frac{I_{BG}}{K_{27}}} + V_{t27} - V_{t221}$$

$$= \left(\sqrt{\frac{I_{BG}}{K_{27}}} - \sqrt{\frac{I_{BG}}{K_{221}}}\right) + I_{25}*R_{273} + (V_{t27} - V_{t221}),$$

wherein $K_{221}$ is a conductance parameter of the transistor 221.

In the third embodiment, the transistor 221 and the bias transistor 274 are the same type of transistor (both are n-type transistors or both are p-type transistors), and the transistor 221 and the bias transistor 274 also have equal channel lengths. Hence the threshold voltage $V_{t27}$ is equivalent to the threshold voltage $V_{t221}$. Accordingly, from the above equation (4), the source voltage $V_{S221}$ can be represented as follows:

$$V_{S221} = \left(\sqrt{\frac{I_{BG}}{K_{26}}} - \sqrt{\frac{I_{BG}}{K_{221}}}\right) + I_{25}*R_{273} \qquad (5)$$

According to (5), the source voltage $V_{S221}$ of the transistor 221 of the common gate amplifier 22 (i.e., the source voltage $V_{S211}$ of the switch transistor 211 of the passive mixer circuit 21) is a fixed voltage and is unrelated to the variations of the semiconductor process.

In the third embodiment, the switch transistor 211 of the passive mixer circuit 21 and the bias transistor 264 are the same type of transistor (both are n-type transistors or both are p-type transistors), and the switch transistor 211 and the bias transistor 264 also have equal channel lengths. Hence the threshold voltage $V_{t26}$ is equivalent to the threshold voltage $V_{t211}$. Accordingly, from the above equation (4), the overdrive voltage $V_{OV211}$ can be represented as follows:

$$V_{OV211} = V_{GS211} - V_{t211} \qquad (6)$$

$$= V_{LO} - V_{S221} - V_{t211}$$

$$= V_{BIAS26} - V_{S221} - V_{t211}$$

$$= I_{25}*R_{263} + \sqrt{\frac{I_{BG}}{K_{26}}} + V_{t26} - \left(\sqrt{\frac{I_{BG}}{K_{27}}} - \sqrt{\frac{I_{BG}}{K_{221}}}\right) - I_{25}*$$

$$R_{273} - V_{t211}$$

$$= \left(\sqrt{\frac{I_{BG}}{K_{26}}} + \sqrt{\frac{I_{BG}}{K_{27}}} - \sqrt{\frac{I_{BG}}{K_{221}}}\right) + I_{25}*(R_{263} - R_{273})$$

According to (6), the overdrive voltage $V_{OV211}$ of the switch transistor 211 of the passive mixer circuit 21 is unrelated to the threshold voltage $V_{t26}$ and the threshold voltage $V_{t211}$, and the alternating current signals $S_{i21}$ is only related to the overdrive voltage $V_{OV211}$ and a conductance parameter of the switch transistor 211. Therefore the alternating current signals $S_{i21}$ output from the switch transistor 211 of the passive mixer circuit 21 is unrelated to the threshold voltage $V_{t26}$ and the threshold voltage $V_{t211}$, and the alternating current signals $S_{i21}$ are unrelated to the variations of the semiconductor process.

Unlike the DC bias circuit 24 disclosed in the second embodiment, the DC bias circuit 25 disclosed in the third embodiment can stabilize the alternating current signals $S_{i21}$ output from the passive mixer circuit 21 of the radio frequency receiver circuit so that the alternating current signals $S_{i21}$ are unrelated to the variation of the semiconductor process (i.e., the alternating current signals $S_{i21}$ are unrelated to the threshold voltage $V_{t211}$ of the switch transistor 211 of the passive mixer circuit 21 and the threshold voltage $V_{t221}$ of the transistor 221 of the common gate amplifier 22).

Accordingly, in the third embodiment, the switch transistor 211 of the passive mixer circuit 21 and the bias transistor 264 of the first DC bias circuit 26 have equal channel lengths, and the transistor 221 of the common gate amplifier 22 and the bias transistor 274 of the first DC bias circuit 27 have equal channel lengths so that current values of the alternating current signals output from the passive mixer circuit 21 is unrelated to the threshold voltage $V_{t211}$ of the switch transistor 211.

Figure 3A:
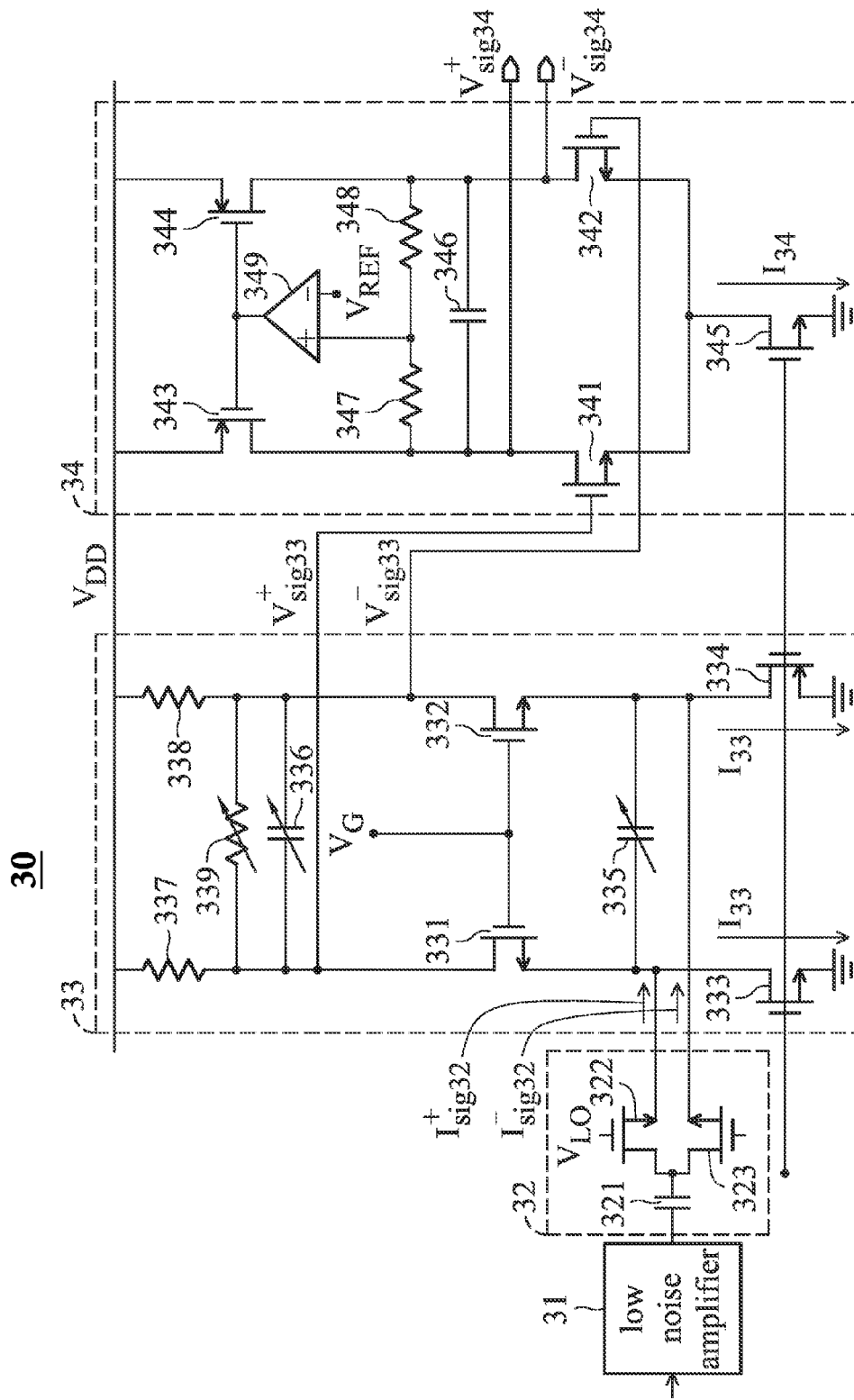
FIG. 3A is a circuit diagram of a radio frequency receiver circuit 30 according to a fourth embodiment of the present invention.

FIG. 3A is a circuit diagram of a radio frequency receiver circuit 30 according to a fourth embodiment of the present invention. In the fourth embodiment, the radio frequency receiver circuit 30 comprises a low noise amplifier 31, a passive complementary metal-oxide-semiconductor (CMOS) mixer circuit 32, a differential common gate trans-impedance amplifier 33, and a differential common source amplifier 34. The low noise amplifier 31 is used to process the radio frequency signals received from the antenna 11. The passive CMOS mixer circuit 32 is used to perform a down-conversion operation on the signals processed by the low noise amplifier 31, and outputs a plurality of differential alternating current signals $I_{sig32+}$ and $I_{sig32-}$. The differential common gate trans-impedance amplifier 33 receives the differential alternating current signals $I_{sig32+}$ and $I_{sig32-}$, and outputs a plurality of corresponding differential alternating voltage signals $V_{sig33+}$ and $V_{sig33-}$. The differential common source amplifier 34 amplifies the differential alternating voltage signals $V_{sig33+}$ and $V_{sig33-}$, and outputs a plurality of corresponding differential alternating voltage signals $V_{sig34+}$ and $V_{sig34-}$.

In the fourth embodiment, the passive CMOS mixer circuit 32 comprises a capacitor 321, a capacitor 322, a transistor 323, and a transistor 324. In the fourth embodiment, the capacitor 321 of the passive CMOS mixer circuit 32 is used for DC block. In the fourth embodiment, a drain of the transistor 323 and a drain of the transistor 324 are electrically connected to each other and are used to receive the radio frequency signals processed by the low noise amplifier 31. A gate of the transistor 323 of the passive CMOS mixer circuit 32 is used to induce a periodic signal generated by an oscillator. Similarly, a gate of the transistor 324 is also used to induce the periodic signal. A source of the transistor 323 of the passive CMOS mixer circuit 32 is used to output the differential alternating current signals $I_{sig32+}$, and a source of the transistor 324 of the passive CMOS mixer circuit 32 is used to output the differential alternating current signals $I_{sig32-}$.

In the fourth embodiment, the differential common gate trans-impedance amplifier 33 comprises a transistor 331, a transistor 332, a transistor 333, a transistor 334, a capacitor 335, a capacitor 336, a resistor 337, a resistor 338, and a resistor 339. The main function of the differential common gate trans-impedance amplifier 33 of the radio frequency receiver circuit 30 is converting current signals into voltage signals. In the fourth embodiment, the transistor 331 and the transistor 332 are used as differential input pair transistors of the differential common gate trans-impedance amplifier 33. Hence a source of the transistor 331 of the differential common gate trans-impedance amplifier 33 is used to receive the differential alternating current signals $I_{sig32+}$, and a source of the transistor 332 of the differential common gate trans-impedance amplifier 33 is used to receive the differential alternating current signals $I_{sig32-}$. A drain of the transistor 331 of the differential common gate trans-impedance amplifier 33 is used to output the differential alternating current signals $I_{sig33+}$, and a drain of the transistor 332 of the differential common gate trans-impedance amplifier 33 is used to output the differential alternating current signals $I_{sig33-}$.

In the fourth embodiment, the transistor 333 and the transistor 334 form a current mirror as a current source of the differential common gate trans-impedance amplifier 33. In the fourth embodiment, the current flowing through the transistor 333 and the current flowing through the transistor 334 are both a constant current $I_{33}$ with 75 μA, but the present invention is not limited thereto. The capacitor 335 is used as an input capacitor of the differential common gate trans-impedance amplifier 33. The resistor 337 and the resistor 338 are used as an output load of the differential common gate trans-impedance amplifier 33. The capacitor 336 and the resistor 339 can be respectively a variable capacitor and a variable resistor for adjusting the output impedance of the differential common gate trans-impedance amplifier 33.

In the fourth embodiment, the differential common source amplifier 34 comprises a transistor 341, a transistor 342, a transistor 343, a transistor 344, a transistor 345, a capacitor 346, a resistor 347, a resistor 348, and a comparator 339. The main function of the differential common source amplifier 34 of the radio frequency receiver circuit 30 is providing a sufficiently large voltage gain. In the fourth embodiment, the transistor 341 and the transistor 342 are used as differential input pair transistors of the differential common source amplifier 34. Hence a gate of the transistor 331 of the differential common source amplifier 34 is used to receive the differential alternating voltage signals $V_{sig33+}$, and a gate of the transistor 332 of the differential common source amplifier 34 is used to receive the differential alternating voltage signals $V_{sig33-}$. A drain of the transistor 331 of the differential common source amplifier 34 is used to output the differential alternating voltage signals $V_{sig34+}$, and a drain of the transistor 332 of the differential common source amplifier 34 is used to output the differential alternating voltage signals $V_{sig34-}$. In the fourth embodiment, the transistor 343 and the transistor 344 are used as active loads of the differential common source amplifier 34. In the fourth embodiment, the transistor 333, the transistor 334 and the transistor 345 form the current mirror, wherein the current flowing through the transistor 345 is a constant current $I_{34}$ with 200 μA. The capacitor 346, the resistor 347 and the resistor 348 are used as passive loads of the differential common source amplifier 34.

Figure 3B:
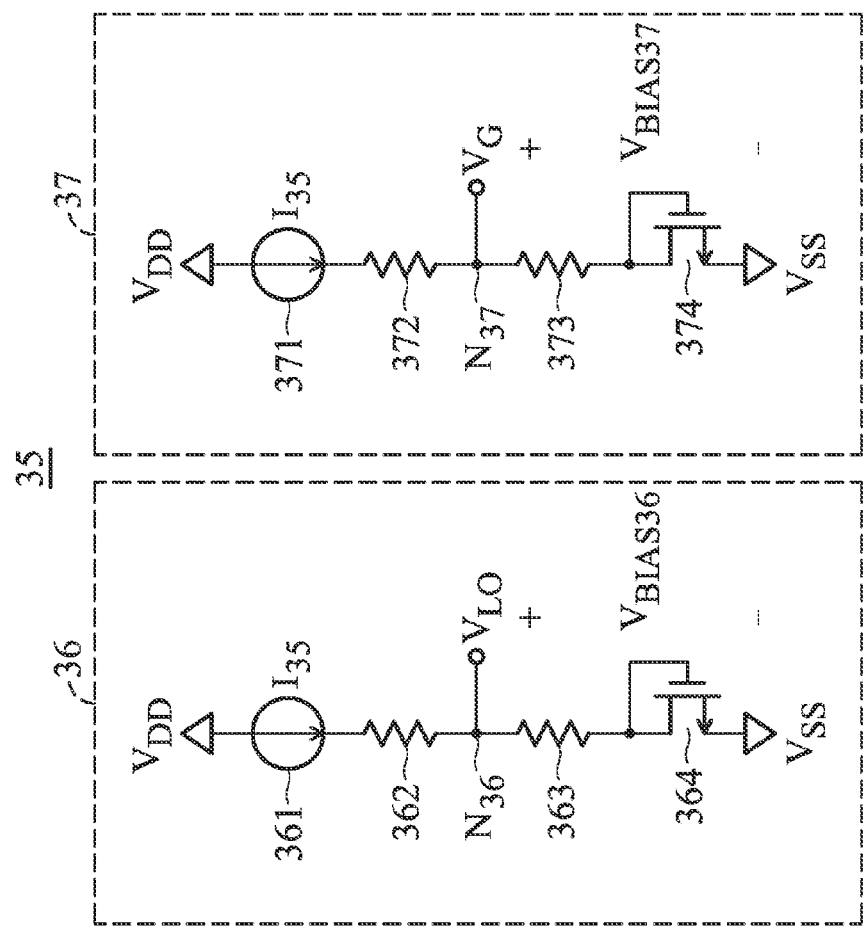
FIG. 3B is a circuit diagram of a DC bias circuit 35 used to DC bias a passive complementary metal-oxide-semiconductor mixer circuit 32 and a differential trans-impedance amplifier 33 according to a fifth embodiment of the present invention.

FIG. 3B is a circuit diagram of a DC bias circuit 35 used to DC bias a passive complementary metal-oxide-semiconductor mixer circuit 32 and a differential trans-impedance amplifier 33 according to a fifth embodiment of the present invention. In the fifth embodiment, the DC bias circuit 35 provides a DC bias voltage $V_{BIAS36}$ and a DC bias voltage $V_{BIAS37}$. The DC bias circuit 35 comprises a first DC bias circuit 36 and a second DC bias circuit 37. The first DC bias circuit 36 is used to provide the DC bias voltage $V_{BIAS36}$ to the gate of the transistor 322 and the gate of the transistor 323 of passive CMOS mixer circuit 32, and the second DC bias circuit 37 is used to provide the DC bias voltage $V_{BIAS37}$ to the gate of the transistor 331 and the gate of the transistor 332 of the differential common gate trans-impedance amplifier 33.

In the fifth embodiment, the first DC bias circuit 36 comprises a current source 361, a resistor 362, a resistor 363, and a bias transistor 364. The current source 361 is electrically connected between the first voltage source $V_{DD}$ and the resistor 362. The current source 361 provides a constant current $I_{35}$ flowing through the resistor 362, the resistor 363, and the bias transistor 364. The resistor 362 is electrically connected between a terminal of the resistor 363 and the current source 361. The other terminal of the resistor 363 is electrically connected to a gate and a drain of the bias transistor 364, i.e. the gate and the drain of the bias transistor 364 electrically connects to each other. A source of the bias transistor 364 is electrically connected to the second voltage source $V_{SS}$. In the fifth embodiment, the second voltage source $V_{SS}$ is electrically connected to ground. In the third embodiment, the DC bias voltage $V_{BIAS36}$ is equivalent to a voltage across the resistor 363 plus a voltage across the gate and the drain of the bias transistor 364.

In the fifth embodiment, the second DC bias circuit 37 comprises a current source 371, a resistor 372, a resistor 373, and a bias transistor 374. The current source 371 is electrically connected between the first voltage source $V_{DD}$ and the resistor 372. The current source 371 provides the constant current $I_{35}$ flowing through the resistor 372, the resistor 373, and the bias transistor 374. The resistor 372 is electrically connected between a terminal of the resistor 373 and the current source 371. The other terminal of the resistor 373 is electrically connected to a gate and a drain of the bias transistor 374, i.e. the gate and the drain of the bias transistor 374 electrically connects to each other. A source of the bias transistor 374 is electrically connected to the second voltage source $V_{SS}$. In the fifth embodiment, the second voltage source $V_{SS}$ is electrically connected to ground. In the fifth embodiment, the DC bias voltage $V_{BIAS37}$ is equivalent to a voltage across the resistor 373 plus a voltage across the gate and the drain of the bias transistor 374.

Figure 3C:
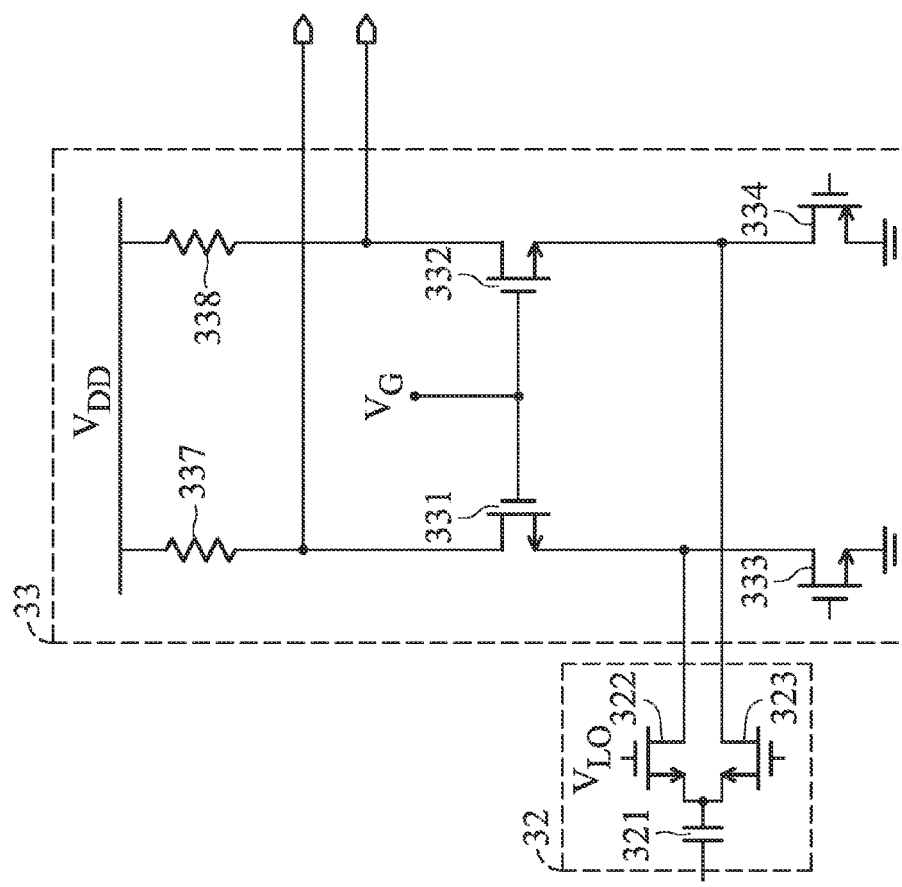
FIG. 3C is an equivalent circuit of the passive complementary metal-oxide-semiconductor mixer circuit 32 and the differential trans-impedance amplifier 33 with DC analysis.

FIG. 3C is an equivalent circuit of the passive complementary metal-oxide-semiconductor mixer circuit 32 and the differential trans-impedance amplifier 33 with DC analysis. As shown in FIG. 3C, the transistor 322 of the passive CMOS mixer circuit 32 is corresponding to the output transistor 211 of the passive mixer circuit shown 21 in FIG. 2A, the input transistor 331 of the differential trans-impedance amplifier is corresponding to the input transistor 221 of the common gate amplifier 22 shown in FIG. 2A, and the current source transistor 333 of the differential trans-impedance amplifier 33 is corresponding to the current source transistor 201 shown in FIG. 2A. Accordingly, method of operation of the DC bias circuit 35 of the fifth embodiment of the present invention is the same as the method of operation of the DC bias circuit 25 of the third embodiment of the present invention.

As the DC bias circuit 25 of the third embodiment, the DC bias circuit 35 of the fifth embodiment can stabilize the differential alternating current signals $I_{sig32+}$ and $I_{sig32-}$ output from the passive CMOS mixer circuit 32 of the radio frequency receiver circuit 30 so that the alternating current signals $I_{sig32+}$ and $I_{sig32-}$ are unrelated to the variation of the semiconductor process (i.e., the alternating current signals $I_{sig32+}$ and $I_{sig32-}$ are unrelated to a threshold voltage $V_{t322}$ of the transistor 322 and a threshold voltage $V_{t323}$ of the transistor 323 of the passive CMOS mixer circuit 32, and also unrelated to a threshold voltage $V_{t331}$ of the input transistor 331 and a threshold voltage $V_{t332}$ of the input transistor 332 of the differential trans-impedance amplifier 33).

Figure 4A:
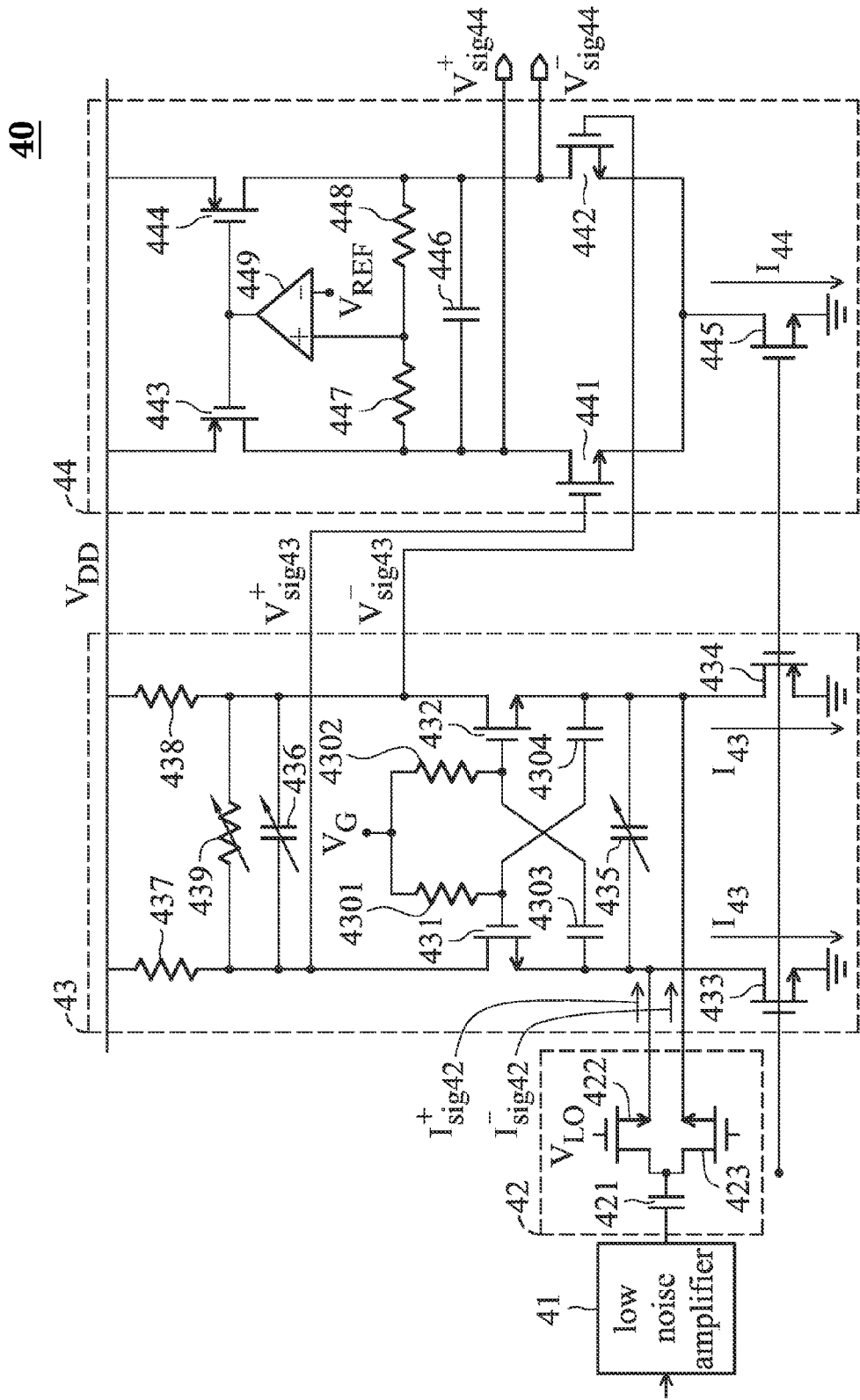
FIG. 4A is a circuit diagram of a radio frequency receiver circuit 40 according to a sixth embodiment of the present invention.

FIG. 4A is a circuit diagram of a radio frequency receiver circuit 40 according to a sixth embodiment of the present invention. In the sixth embodiment, the radio frequency receiver circuit 40 comprises a low noise amplifier 41, a passive complementary metal-oxide-semiconductor (CMOS) mixer circuit 42, a gm-boost differential trans-impedance amplifier 43, and a differential common source amplifier 44. The low noise amplifier 41 is used to process the radio frequency signals received from the antenna 11. The passive CMOS mixer circuit 42 is used to perform a down-conversion operation on the signals processed by the low noise amplifier 41, and outputs a plurality of differential alternating current signals $I_{sig42+}$ and $I_{sig42-}$. The gm-boost differential trans-impedance amplifier 43 receives the differential alternating current signals $I_{sig42+}$ and $I_{sig42-}$, and outputs a plurality of corresponding differential alternating voltage signals $V_{sig43+}$ and $V_{sig43-}$. The differential common source amplifier 44 amplifies the differential alternating voltage signals $V_{sig43+}$ and $V_{sig43-}$, and outputs a plurality of corresponding differential alternating voltage signals $V_{sig44+}$ and $V_{sig44-}$.

In the sixth embodiment, the passive CMOS mixer circuit 42 comprises a capacitor 421, a capacitor 422, a transistor 423, and a transistor 424. In the sixth embodiment, the capacitor 421 of the passive CMOS mixer circuit 42 is used for DC block. In the sixth embodiment, a drain of the transistor 423 and a drain of the transistor 424 are electrically connected to each other and are used to receive the radio frequency signals processed by the low noise amplifier 41. A gate of the transistor 423 of the passive CMOS mixer circuit 42 is used to induce a periodic signal generated by an oscillator. Similarly, a gate of the transistor 424 is also used to induce the periodic signal. A source of the transistor 423 of the passive CMOS mixer circuit 42 is used to output the differential alternating current signals $I_{sig42+}$, and a source of the transistor 424 of the passive CMOS mixer circuit 42 is used to output the differential alternating current signals $I_{sig42-}$.

In the sixth embodiment, the gm-boost differential trans-impedance amplifier 43 comprises a X-structure, a transistor 431, a transistor 432, a transistor 433, a transistor 434, a capacitor 435, a capacitor 436, a resistor 437, a resistor 438, and a resistor 439. The only difference between the radio frequency receiver circuit 30 shown in FIG. 3A and the radio frequency receiver circuit 40 shown in FIG. 4A is that the gm-boost differential trans-impedance amplifier 43 shown in FIG. 4A adds the X-structure.

The X-structure comprises a resistor 4301, a resistor 4302, a resistor 4303, and a capacitor 4304, and the connections is shown in FIG. 4A. In the sixth embodiment, the resistor 4301, the resistor 4302, the resistor 4303, and the capacitor 4304 locate at an input stage of the gm-boost differential trans-impedance amplifier 43, and additionally provide a low pass filter. A pole of the low pass filter is represented as follow:

$$\omega_0 = 1 / \sqrt{\left(\frac{1}{g_{m431}}\right) C_{435}},$$

wherein $C_{435}$ is capacitance of the capacitor 435, and gm431 is a trans-conductance of the input transistor 431. The low pass filter is used to reduce noise of the gm-boost differential trans-impedance amplifier 43. Because the gm-boost differential trans-impedance amplifier 43 adds the X-structure, the gm-boost differential trans-impedance amplifier 43 has a better noise factor and larger input admittance than the differential trans-impedance amplifier 33.

Figure 4B:
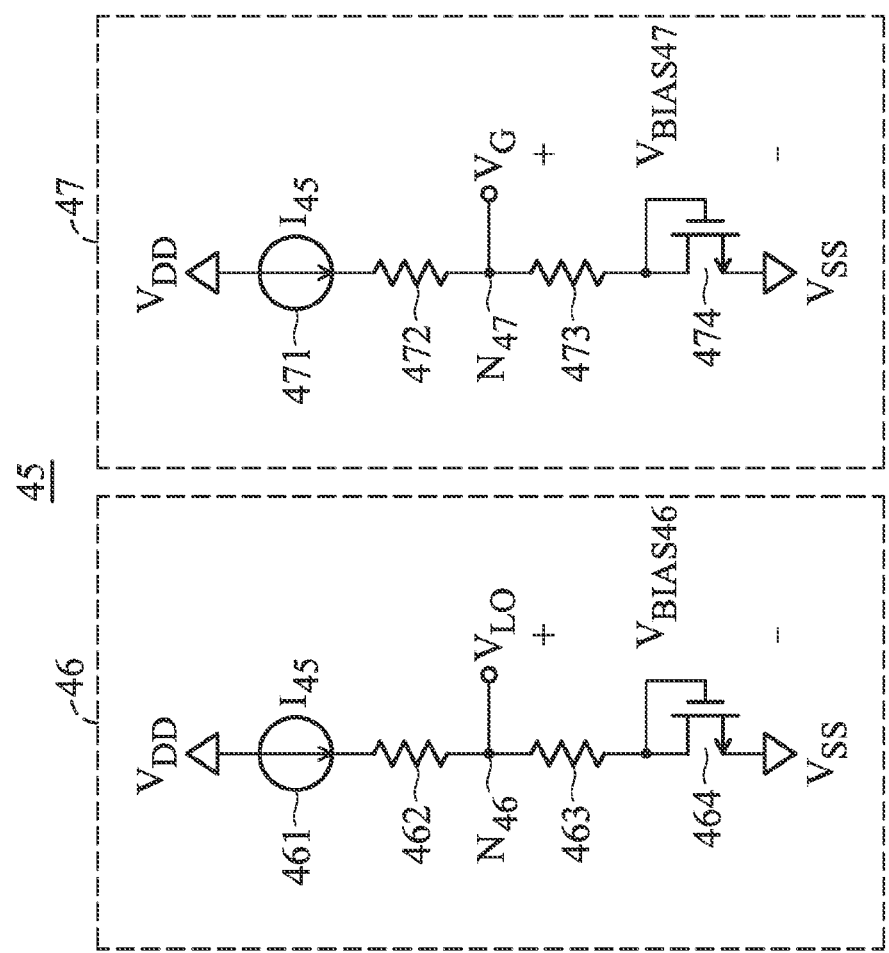
FIG. 4B is a circuit diagram of a DC bias circuit 45 used to DC bias a passive complementary metal-oxide-semiconductor mixer circuit 42 and a gm-boost differential trans-impedance amplifier 43 according to a seventh embodiment of the present invention.

FIG. 4B is a circuit diagram of a DC bias circuit 45 used to DC bias a passive complementary metal-oxide-semiconductor mixer circuit 42 and a gm-boost differential trans-impedance amplifier 43 according to a seventh embodiment of the present invention. In the seventh embodiment, the DC bias circuit 45 provides a DC bias voltage $V_{BIAS46}$ and a DC bias voltage $V_{BIAS47}$. The DC bias circuit 45 comprises a first DC bias circuit 46 and a second DC bias circuit 47. The first DC bias circuit 46 is used to provide the DC bias voltage $V_{BIAS46}$ to the gate of the transistor 422 and the gate of the transistor 423 of passive CMOS mixer circuit 42, and the second DC bias circuit 47 is used to provide the DC bias voltage $V_{BIAS47}$ to the gate of the input transistor 431 and the gate of the input transistor 432 of the gm-boost differential trans-impedance amplifier 43.

In the seventh embodiment, the first DC bias circuit 46 comprises a current source 461, a resistor 462, a resistor 463, and a bias transistor 464. The current source 461 is electrically connected between the first voltage source $V_{DD}$ and the resistor 462. The current source 461 provides a constant current $I_{45}$ flowing through the resistor 462, the resistor 463, and the bias transistor 464. The resistor 462 is electrically connected between a terminal of the resistor 463 and the current source 461. The other terminal of the resistor 463 is electrically connected to a gate and a drain of the bias transistor 464, i.e. the gate and the drain of the bias transistor 464 electrically connects to each other. A source of the bias transistor 464 is electrically connected to the second voltage source $V_{SS}$. In the seventh embodiment, the second voltage source $V_{SS}$ is electrically connected to ground. In the third embodiment, the DC bias voltage $V_{BIAS46}$ is equivalent to a voltage across the resistor 463 plus a voltage across the gate and the drain of the bias transistor 464.

In the seventh embodiment, the second DC bias circuit 47 comprises a current source 471, a resistor 472, a resistor 473, and a bias transistor 474. The current source 471 is electrically connected between the first voltage source $V_{DD}$ and the resistor 472. The current source 471 provides the constant current $I_{45}$ flowing through the resistor 472, the resistor 473, and the bias transistor 474. The resistor 472 is electrically connected between a terminal of the resistor 473 and the current source 471. The other terminal of the resistor 473 is electrically connected to a gate and a drain of the bias transistor 474, i.e. the gate and the drain of the bias transistor 474 electrically connects to each other. A source of the bias transistor 474 is electrically connected to the second voltage source $V_{SS}$. In the seventh embodiment, the second voltage source $V_{SS}$ is electrically connected to ground. In the seventh embodiment, the DC bias voltage $V_{BIAS47}$ is equivalent to a voltage across the resistor 473 plus a voltage across the gate and the drain of the bias transistor 474.

Figure 4C:
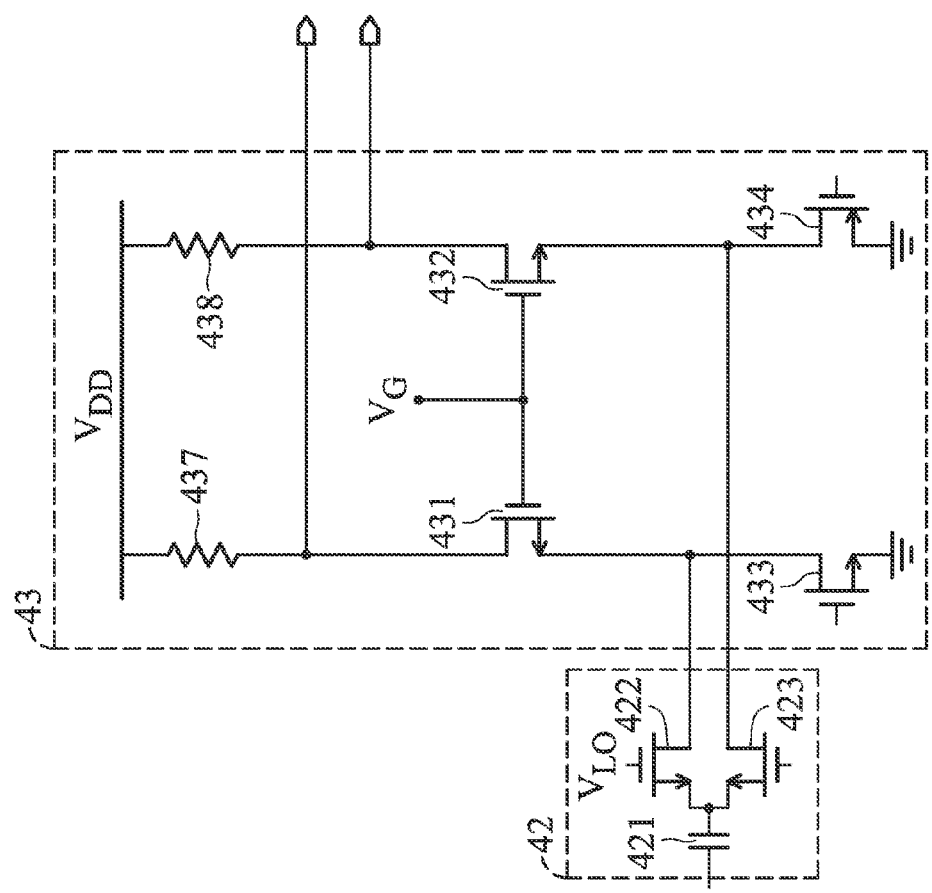
FIG. 4C is an equivalent circuit of the passive complementary metal-oxide-semiconductor mixer circuit 42 and the gm-boost differential trans-impedance amplifier 43 with DC analysis.

FIG. 4C is an equivalent circuit of the passive complementary metal-oxide-semiconductor mixer circuit 42 and the gm-boost differential trans-impedance amplifier 43 with DC analysis. As shown in FIG. 4C, the transistor 422 of the passive CMOS mixer circuit 42 is corresponding to the output transistor 211 of the passive mixer circuit shown 21 in FIG. 2A, the input transistor 431 of the gm-boost differential trans-impedance amplifier 43 is corresponding to the input transistor 221 of the common gate amplifier 22 shown in FIG. 2A, and the current source transistor 433 of the gm-boost differential trans-impedance amplifier 43 is corresponding to the current source transistor 201 shown in FIG. 2A. Accordingly, method of operation of the DC bias circuit 45 of the seventh embodiment of the present invention is the same as the method of operation of the DC bias circuit 25 of the third embodiment of the present invention.

As the DC bias circuit 25 of the third embodiment, the DC bias circuit 45 of the seventh embodiment can stabilize the differential alternating current signals $I_{sig42+}$ and $I_{sig42-}$ output from the passive CMOS mixer circuit 42 of the radio frequency receiver circuit 40 so that the alternating current signals $I_{sig42+}$ and $I_{sig42-}$ are unrelated to the variation of the semiconductor process (i.e., the alternating current signals $I_{sig42+}$ and $I_{sig42-}$ are unrelated to a threshold voltage $V_{t422}$ of the transistor 422 and a threshold voltage $V_{t423}$ of the transistor 423 of the passive CMOS mixer circuit 42, and also unrelated to a threshold voltage $V_{t431}$ of the input transistor 431 and a threshold voltage $V_{t342}$ of the input transistor 342 of the gm-boost differential trans-impedance amplifier 43).

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using another structure, functionality, or structure and functionality in addition to or other than one or more of the aspects set forth herein. As an example of some of the above concepts, in some aspects, concurrent channels may be established based on pulse repetition frequencies. In some aspects, concurrent channels may be established based on pulse position or offsets. In some aspects, concurrent channels may be established based on time hopping sequences. In some aspects, concurrent channels may be established based on pulse repetition frequencies, pulse positions or offsets, and time hopping sequences.

While the present disclosure has been described by way of example and in terms of preferred embodiment, it should be understood that the present disclosure is not limited thereto. On the contrary, it is intended to cover various modifications and similar arrangements (as would be apparent to a person skilled in the art). Therefore, the scope of the appended claims should be accorded the broadest interpretation so as to encompass all such modifications and similar arrangements.

What is claimed is:

1. A DC bias circuit for DC biasing a mixer circuit and a common gate amplifier circuit, the DC bias circuit comprising:
    a first biasing circuit, comprising a first biasing transistor and a first biasing resistor, wherein the first biasing transistor and the first biasing resistor provide a first DC bias voltage to an output transistor of the mixer circuit so that the output transistor operates in a saturation region,
        wherein the first biasing transistor and the output transistor are the same type of transistor and have equal channel lengths; and
    a second biasing circuit, comprising a second biasing transistor and a second biasing resistor, wherein the second biasing transistor and the second biasing resistor provide a second DC bias voltage to an input transistor of the common gate amplifier circuit so that the input transistor operates in the saturation region,
        wherein the second biasing transistor and the input transistor are the same type of transistor and have equal channel lengths, and
        wherein when the input transistor and the output transistor all operate in the saturation region, a plurality of alternating current signals output from the mixer circuit is unrelated to a threshold voltage of the output transistor, and the alternating current signals is unrelated to a threshold voltage of the input transistor.

2. The DC bias circuit of claim 1, wherein the common gate amplifier circuit is a differential common gate amplifier, and the differential common gate amplifier further comprises another input transistor,
    wherein the second biasing circuit provides the second DC bias voltage to the other input transistor through the second biasing transistor and the second biasing resistor so that the other input transistor operates in the saturation region, and
    wherein the second biasing transistor and the other input transistor are the same type of transistor and have equal channel lengths.

3. The DC bias circuit of claim 1, wherein the mixer circuit is a passive complementary metal-oxide-semiconductor (CMOS) mixer circuit, and the passive CMOS mixer circuit further comprises another output transistor,
    wherein the first biasing circuit provides the first DC bias voltage to the other output transistor through the first biasing transistor and the first biasing resistor so that the other output transistor operates in the saturation region, and
    wherein the first biasing transistor and the other output transistor are the same type of transistor and have equal channel lengths.

4. A DC bias circuit for DC biasing a mixer circuit and a common gate amplifier circuit, the DC bias circuit comprising:
    a first biasing circuit, providing a first DC bias voltage to a gate of a first transistor of the mixer circuit so that the first transistor operates in a saturation region, wherein the first biasing circuit comprises:
        a third transistor, wherein a gate and a drain of the third transistor are electrically connected to a first node, a source of the third transistor is electrically connected to ground, and the first and third transistor are the same type of transistor;
        a first resistor, electrically connected between the gate of the first transistor and the first node; and
        a first current source, used to output a first DC current to the third transistor; and
    a second biasing circuit, providing a second DC bias voltage to a gate of a second transistor of the common gate amplifier circuit so that the second transistor operates in a saturation region, wherein the second biasing circuit comprises:

a fourth transistor, wherein a gate and a drain of the fourth transistor are electrically connected to a second node, a source of the fourth transistor is electrically connected to ground, and the second and fourth transistor are the same type of transistor;

a second resistor, electrically connected between the gate of the second transistor and the second node; and a second current source, used to output a second DC current to the fourth transistor, wherein the mixer circuit receives a high-frequency input signal through a drain of the first transistor and outputs an alternating current signal through a source of the first transistor, wherein the common gate amplifier circuit receives the alternating current signal through a source of the second transistor and outputs an alternating voltage signal through a drain of the second transistor, wherein the source of the first transistor and the source of the second transistor are electrically connected to a third node, and a third current source is electrically connected between the third node and ground, and wherein the first and third transistors have equal channel lengths, and the second and fourth transistors have equal channel lengths so that a plurality of alternating current signals output from the mixer circuit is unrelated to a threshold voltage of the output transistor.

5. A radio frequency receiver circuit, comprising:

a mixer circuit, comprising a first transistor, wherein the mixer circuit receives a plurality of radio frequency signals by a drain of the first transistor and outputs a plurality of alternating current signals by a source of the first transistor;

a common gate amplifier circuit, comprising a second transistor, wherein the common gate amplifier circuit receives the alternating current signals through a source of the second transistor and outputs a plurality of alternating voltage signals through a drain of the second transistor;

a first biasing circuit, used to provide a first DC bias voltage to a gate of the first transistor of the mixer circuit so that the first transistor operates in a saturation region, wherein the first biasing circuit comprises:

a third transistor, wherein a gate and a drain of the third transistor are electrically connected to a first node, a source of the third transistor is electrically connected to ground, and the first and third transistor are the same type of transistor;

a first resistor, electrically connected between the gate of the first transistor and the first node; and a first current source, used to output a first DC current to the third transistor; and a second biasing circuit, providing a second DC bias voltage to a gate of the second transistor of the common gate amplifier circuit so that the second transistor operates in a saturation region, wherein the second biasing circuit comprises:

a fourth transistor, wherein a gate and a drain of the fourth transistor are electrically connected to a second node, a source of the fourth transistor is electrically connected to ground, and the second and fourth transistor are the same type of transistor;

a second resistor, electrically connected between the gate of the second transistor and the second node; and a second current source, used to output a second DC current to the fourth transistor, wherein the mixer circuit receives a high-frequency input signal through the drain of the first transistor and outputs an alternating current signal through the source of the first transistor, wherein the source of the first transistor and the source of the second transistor are electrically connected to a third node, and a third current source is electrically connected between the third node and ground, and wherein the first and third transistors have equal channel lengths, and the second and fourth transistors have equal channel lengths so that a plurality of alternating current signals output from the mixer circuit is unrelated to a threshold voltage of the output transistor.

* * * * *